United States Patent
Morikawa

(10) Patent No.: US 10,559,471 B2
(45) Date of Patent: Feb. 11, 2020

(54) METHOD OF MANUFACTURING BONDED WAFER

(71) Applicant: SUMCO CORPORATION, Tokyo (JP)

(72) Inventor: Yasuyuki Morikawa, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/244,603

(22) Filed: Jan. 10, 2019

(65) Prior Publication Data

US 2019/0221435 A1 Jul. 18, 2019

(30) Foreign Application Priority Data

Jan. 18, 2018 (JP) .................. 2018-006289

(51) Int. Cl.
| | |
|---|---|
| *H01L 21/304* | (2006.01) |
| *B24B 7/22* | (2006.01) |
| *H01L 21/762* | (2006.01) |
| *H01L 21/02* | (2006.01) |

(52) U.S. Cl.
CPC ............ *H01L 21/304* (2013.01); *B24B 7/228* (2013.01); *H01L 21/02021* (2013.01); *H01L 21/02024* (2013.01); *H01L 21/76256* (2013.01)

(58) Field of Classification Search
CPC ............. H01L 21/304; H01L 21/76256; H01L 21/02021; H01L 21/02024; B24B 7/228
USPC ....................................................... 438/691
See application file for complete search history.

(56) References Cited

U.S. PATENT DOCUMENTS

| | | | |
|---|---|---|---|
| 7,855,129 B2 | 12/2010 | Morita et al. | |
| 2008/0315349 A1* | 12/2008 | Takei ................... | H01L 21/187 257/506 |
| 2009/0042363 A1* | 2/2009 | Miyazaki .............. | H01L 21/304 438/459 |
| 2011/0207294 A1* | 8/2011 | Nakanishi ............... | B24B 9/065 438/459 |
| 2012/0289025 A1* | 11/2012 | Kato ..................... | H01L 21/304 438/459 |
| 2013/0186853 A1* | 7/2013 | Sugimoto ......... | G02F 1/133351 216/23 |
| 2013/0273714 A1* | 10/2013 | Wei ..................... | H01L 21/3226 438/458 |

(Continued)

FOREIGN PATENT DOCUMENTS

JP H01-227441 A 9/1989

*Primary Examiner* — Binh X Tran
(74) *Attorney, Agent, or Firm* — Greenblum & Bernstein, P.L.C.

(57) ABSTRACT

Disclosed is a method of manufacturing a bonded wafer, wherein a terrace forming step is carried out using a chamfering wheel which comprise a low grit number grinding stone and a high grit number grinding stone having a higher grit number than the low grit number grinding stone, and wherein the terrace forming step comprises: a coarse chamfering step of chamfering, after chamfering the active layer wafer, the insulating film from the active layer wafer side and further chamfering the support substrate wafer, using the low grit number grinding stone; and a finish chamfering step of finish chamfering, after the coarse chamfering step, a machined surface obtained from the coarse chamfering step, using the high grit number grinding stone.

6 Claims, 7 Drawing Sheets

(56) References Cited

U.S. PATENT DOCUMENTS

2015/0206790 A1\* 7/2015 Aga ................ H01L 21/76254
438/458
2016/0365239 A1\* 12/2016 Hagimoto ......... H01L 21/02378

\* cited by examiner

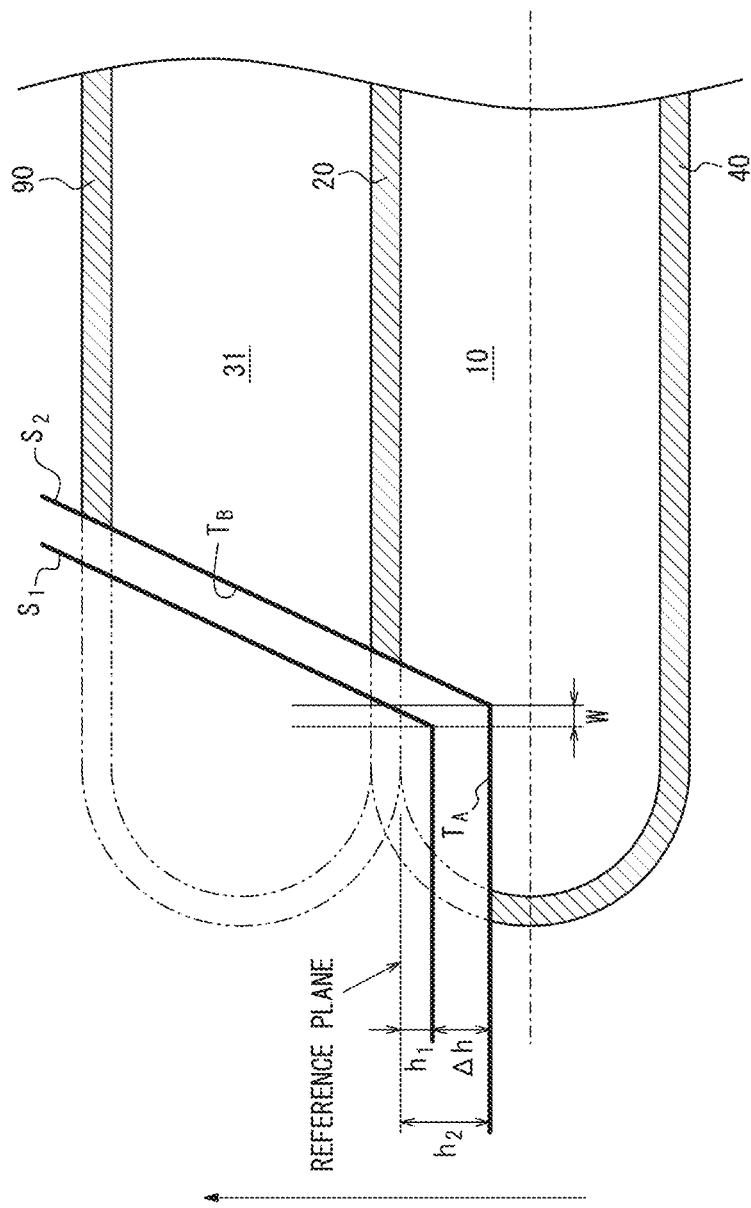

METHOD OF MANUFACTURING BONDED WAFER

TECHNICAL FIELD

The present disclosure relates to a method of manufacturing a bonded wafer.

BACKGROUND

As semiconductor wafers, silicon wafers made of single crystal silicon and bulk wafers made of compound semiconductor such as GaAs (hereinafter may be simply referred to as "bulk wafers") are known. Also known are bonded wafers wherein an insulating film is provided on a surface of a bulk wafer and the bulk wafer is bonded to an active layer wafer with the insulating film. In such a bonded wafer, typically, the active layer wafer is further thinned to form an active layer, which is used as a semiconductor device formation area. Active layer wafers may or may not be of the same type of wafer as bulk wafers.

Particularly recently, SOI wafers having an SOI (silicon-on-insulator) structure have attracted attention in the fields of highly integrated CMOS devices and high breakdown voltage devices, as well as in the field of image sensors. The SOI wafer sequentially includes, on a support substrate, an insulating film such as silicon oxide ($SiO_2$) film and a semiconductor layer such as a single crystal silicon layer used as a device active layer. While bulk silicon substrates have a relatively large parasitic capacitance that may be generated between the device and substrate, SOI wafers can significantly reduce the parasitic capacitance and therefore are advantageous in increasing the device speed, increasing the device breakdown voltage, reducing the device power consumption, etc.

In some cases, bonded wafers such as SOI wafers have a region called "terrace" formed around the outer periphery of the active layer for various purposes, such as preventing chipping. Further, a portion where such a terrace is provided (terrace portion) may be used for wafer handling in a device forming process for fabricating semiconductor devices in a bonded wafer.

By way of example, PTL 1 discloses an SOI wafer 900 wherein, as shown in FIG. 1, an active layer 930 made of silicon is provided on a support substrate 910 formed of a Si wafer with a silicon oxide film 920. In the SOI wafer 900, the outer peripheral edge of the active layer 930 is located more inward than the outer peripheral edge of the support substrate 910, and the peripheral edge of the active layer 910 is chamfered. Further, a terrace surface $T_A$ of the SOI wafer 900 is provided on the support substrate 910. Hereinafter, a flat surface region at an outer peripheral portion of a support substrate will be referred to as a terrace surface $T_A$, and a slope surface between a flat surface of an active layer and the terrace surface $T_A$ will be referred to as a terrace slope surface $T_B$. Hereinafter, the terrace surface $T_A$ and the terrace slope surface $T_B$ may be collectively referred to as a "terrace portion."

The technique of PTL 1 makes it possible to prevent chipping at the bonded surface between the support substrate 910 and the active layer 930 or at the peripheral edge of the active layer 930 when the SOI wafer 900 is subjected to a device forming process.

In PTL 1, the following machining is performed in order to form the terrace portion described above. First, while rotating a bonded substrate prior to machining that is held on a wafer clamping table, the bonded substrate is brought close to a diamond electrodeposited surface of a chamfering wheel. By lifting or lowering the wafer clamping table to bring the bonded substrate in contact with a recessed surface, including a slope surface, of the chamfering wheel, a machined surface is then formed at the peripheral portion of each of the support substrate silicon wafer and the active layer silicon wafer.

CITATION LIST

Patent Literature

PTL 1: JPH01227441A

SUMMARY

According to the studies conducted by the present inventor, it was confirmed that the prior art machining method described above results in poorly machined shape during mass production. It was therefore impossible with the prior art method to achieve stable manufacture of a bonded wafer wherein a terrace surface is provided on a support substrate wafer.

An object of the present disclosure in light of the foregoing problem is therefore to provide a method of manufacturing a bonded wafer, which method can stably manufacture a bonded wafer wherein a terrace surface is provided on a support substrate wafer.

The present inventor made extensive studies in order to solve the foregoing problem. The prior art machining method disclosed by PTL 1 performs whole chamfering using a single grinding stone attached to a chamfering wheel when forming a terrace portion. The insulating film of a bonded wafer has a relatively high wear resistance compared to that of a semiconductor wafer such as a silicon wafer. Thus, breakage or wearing of the grinding stone occurs dominantly when chamfering the insulating film at the bonded surface by grinding. If chamfering of insulating films is continued only with a grinding stone with a grit number high enough to enable finish chamfering, insulating films of bonded wafers with later machining lot numbers cannot be ground, resulting in the bonded wafers having poorly machined shape. On the other hand, if chamfering is carried out with only a coarse grinding stone, i.e., a grinding stone with a low grit number, breakage or wearing of the grinding stone by the insulating film does not easily occur, but the machining strain becomes excessive. In this case, much etching is necessary to remove the machining strain that caused after chamfering. However, if much etching is done, the anisotropy becomes undesirably evident due to the difference in etching rate among the active layer, the insulating film and the support substrate.

To solve the problem, the present inventor conceived of forming a terrace portion using a grinding stone with a low grit number for chamfering the insulation layer at the bonded surface and, after chamfering the insulating film, performing finish chamfering using a grinding stone with a high grit number. The present inventor discovered that this also allows removal of the machining strain without any problem, thus completing the present disclosure. That is, the gist of the present disclosure is as follows:

(1) A method of manufacturing a bonded wafer, including:
   a bonding step of bonding a support substrate wafer and an active layer wafer with an insulating film;
   a terrace forming step of forming a terrace surface on the support substrate wafer; and a strain removing step of removing a strained region generated by the terrace forming step, wherein the terrace forming step is carried out using a chamfering wheel which comprise a low grit number grinding stone and a high grit number grinding stone having a higher grit number than the low grit number grinding stone, and wherein the terrace forming step comprises:

a coarse chamfering step of chamfering, after chamfering the active layer wafer, the insulating film from the active layer wafer side and further chamfering the support substrate wafer, using the low grit number grinding stone; and a finish chamfering step of finish chamfering, after the coarse chamfering step, a machined surface obtained from the coarse chamfering step, using the high grit number grinding stone.

(2) The method of (1) above, wherein the chamfering wheel has a multistage structure in which discs having different diameters are concentrically disposed, wherein the low grit number grinding stone is provided at a periphery of an inner diameter portion of the chamfering wheel and the high grit number grinding stone is provided at a periphery of an outer diameter portion located more outward than the inner diameter portion, and wherein the coarse chamfering step and the finish chamfering step are carried out continuously using the chamfering wheel having the multistage structure.

(3) The method of (1) or (2) above, further including, after the terrace forming step, a thinning step of thinning the active layer wafer to provide an active layer.

(4) The method of any one (1) to (3) above, wherein the active layer wafer is formed of a silicon wafer.

(5) The method of any one of (1) to (4) above, wherein the insulating film is made of silicon oxide.

(6) The method of any one of (1) to (5) above, wherein the insulating film is provided on an end surface and a back surface of the support substrate wafer.

According to the present disclosure, it is possible to provide a method of manufacturing a bonded wafer, which method can stably manufacture a bonded wafer wherein a terrace surface is provided on a support substrate wafer.

BRIEF DESCRIPTION OF THE DRAWINGS

In the accompanying drawings:

FIG. 5 is a schematic cross-sectional view for explaining a machined surface in the terrace forming step in the embodiment;

DETAILED DESCRIPTION

Figure 2:
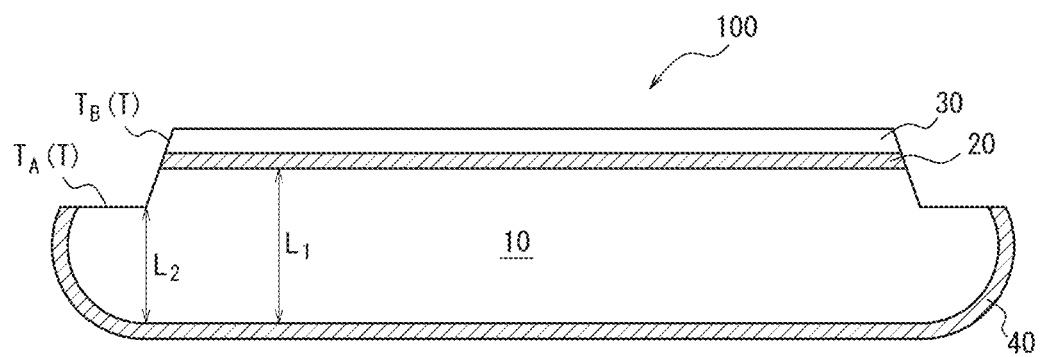
FIG. 2 is a schematic cross-sectional view for explaining a bonded wafer obtained according to an embodiment of the present disclosure.
Figure 3:
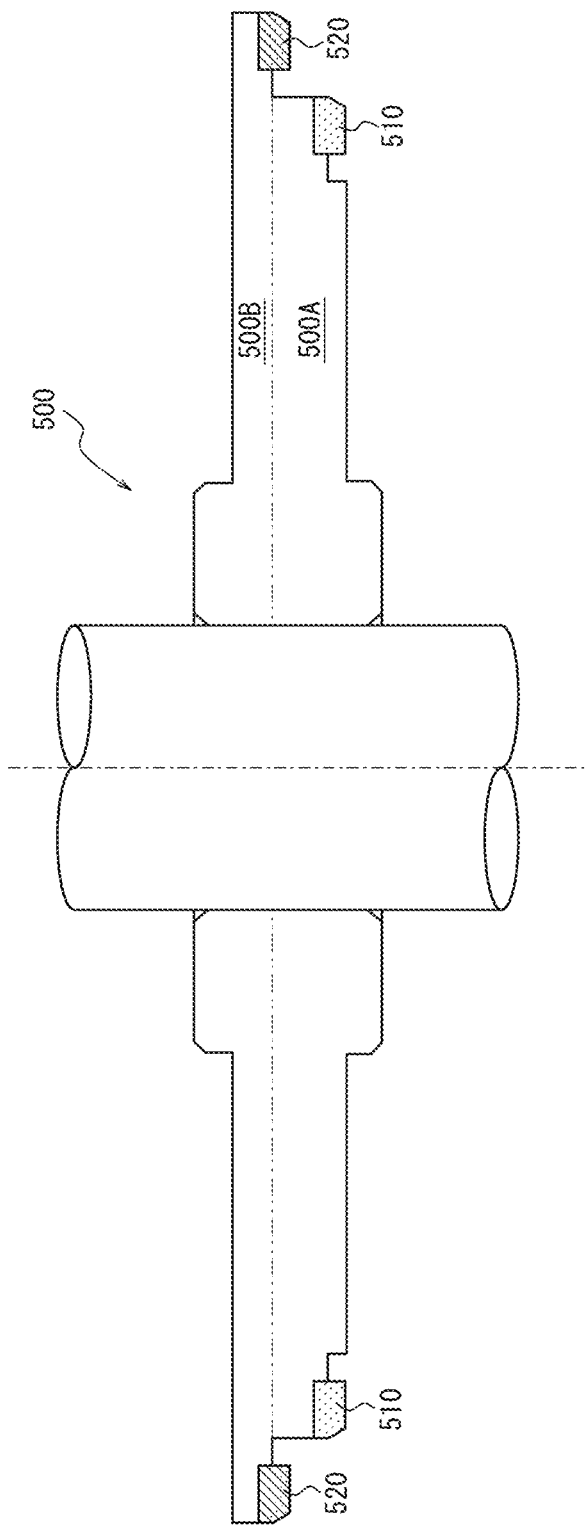
FIG. 3 is a schematic cross-sectional view for explaining a chamfering wheel suitable for use in an embodiment of the present disclosure.

Hereinafter, embodiments of the present disclosure will be described in detail with reference to the drawings. FIG. 2 is a schematic cross-sectional view showing a bonded wafer 100 obtained according to an embodiment of the present disclosure. The bonded wafer 100 includes an active layer 30 provided on a support substrate wafer 10 with an insulating film 20. The active layer 30 is derived from an active layer wafer 31 described later. A flat terrace surface $T_A$ is formed at a peripheral portion of a support substrate wafer 10 and is located on the support substrate wafer 10 side than the insulating film 20 (below outer side of the insulating film 20 in FIG. 2). FIG. 3 is a schematic cross-sectional view of a chamfering wheel 500 having a two-stage structure suitable for the embodiment of the present disclosure. The chamfering wheel 500 has a two-stage structure in which two discs having different diameters are concentrically disposed, wherein a low grit number grinding stone 510 is provided at the periphery of an inner diameter portion 500A and a high grit number grinding stone 520 is provided at the periphery of an outer diameter portion 500B.

An embodiment of the present disclosure for manufacturing such a bonded wafer 100 will be further described with reference to the flowchart of FIG. 4 and the schematic cross-sectional views of FIGS. 5 and 6A to 6C. In each schematic cross-sectional view, for the purpose of simplifying the drawing, the aspect ratios of the support substrate wafer 10, insulating film 20, the active layer 30, the active layer wafer 31 and other structures are shown exaggerated and are different from the actual thickness ratios.

(Method of Manufacturing Bonded Wafer)

A method of manufacturing a bonded wafer 100 according to an embodiment of the present disclosure includes: a bonding step S10 of bonding a support substrate wafer 10 and an active layer wafer 31 with an insulating film 20; a terrace forming step S20 of forming a terrace surface $T_A$ on the support substrate wafer 10; and a strain removing step S30 of removing a strained region generated by the terrace forming step S20, wherein the terrace forming step S20 is carried out using the chamfering wheel 500 which comprises a low grit number grinding stone 510 and a high grit number grinding stone 520 having a higher grit number than the low grit number grinding stone 510. The terrace forming step S20 includes: a coarse chamfering step S21 of chamfering, after chamfering the active layer wafer 31, the insulating film 20 from the active layer wafer 31 side and further chamfering the support substrate wafer 10, using the low grit number grinding stone 510; and a finish chamfering step S22 of finish chamfering, after the coarse chamfering step S21, a machined surface obtained from the coarse chamfering step S21, using the high grit number grinding stone 520. Each step will be described in detail below.

<Bonding Step>

In the bonding step S10, the support substrate wafer 10 and the active layer wafer 31 are bonded together with the insulating film 20. The insulating film 20 serves as a bonding surface between the support substrate wafer 10 and the active layer wafer 31. Any bonding means can be employed in the present embodiment, e.g., the bonding step S10 can be carried out in the manner described below First, the support substrate wafer 10 and the active layer wafer 31 are provided. Next, the insulating film 20 is formed on either one or both of the support substrate wafer 10 and the active layer wafer 31. The insulating film 20 may be formed on the surface to be bonded and may be formed on the entire surface of each wafer. The insulating film 20 can be formed by methods commonly used in the art, such as thermal oxidation. For example, when the support substrate wafer 10 and the active layer wafer 31 are silicon wafers, a silicon oxide film can be formed on a surface portion of the silicon wafer for example by heat treatment in an oxidizing atmosphere, and the silicon oxide film can be used as the insulating film.

Subsequently, the support substrate wafer 10 and the active layer wafer 31 are bonded together with the insulating film 20 thus formed. Bonding can be effected at room temperature and atmospheric pressure. After bonding, it is also preferred to perform heat treatment for strengthening the bonding at the bonded surface.

<Terrace Forming Step>

The terrace forming step S20 following the bonding step S10 will be described with reference to FIG. 5.

First, the coarse chamfering step S21 is carried out using the low grit number grinding stone 510. First, the active layer wafer 31 is chamfered from the active layer wafer 31 side. After chamfering the active layer wafer 31, the insulating film 20 is chamfered and further the support substrate wafer 10 is chamfered. The coarse chamfering step S21 results in the formation of a machined surface $S_1$ on the bonded wafer 100. The machined surface $S_1$ extends across the active layer wafer 31, the insulating film 20 and the support substrate wafer 10. At this stage, a flat surface is formed at a peripheral portion of the support substrate wafer 10.

After the coarse chamfering step S21, the finish chamfering step S22 is carried out using the high grit number grinding stone 520. That is, by performing finish chamfering of the machined surface $S_1$ that extends across the active layer wafer 31, the insulating film 20 and the support substrate wafer 10, the strain generated by using the low grit number grinding stone 510 is removed. After finish chamfering, the terrace surface $T_A$ and the terrace slope surface $T_B$ are formed. The terrace slope surface $T_B$ extends across the active layer wafer 31, the insulating film 20 and the support substrate wafer 10.

It should be noted that FIG. 5 illustrates an embodiment wherein an insulating film 90 provided on the top surface and the end surface of the active layer wafer 31 has been ground such that the insulating film 90 remains only on the top surface. An insulating film 40 is provided on the back surface and the end surface of the support substrate wafer 10. In the present embodiment, although the insulating films 40, 90 are not essential components, it is possible to carry out the terrace forming step S20 with the insulating films 40, 90 being provided, as shown in FIG. 5.

Referring further to FIG. 5, when the flat surface of the support substrate wafer 10 immediately under the insulating film 20 is taken as a reference plane in height direction, it is preferred to set the grinding allowance $h_1$ of the support substrate wafer 10 in height direction in the coarse chamfering step S21 to 10 μm to 300 μm. When the grinding allowance $h_1$ is 10 μm or more, it is possible to achieve stable coarse grinding for the entire circumference of the wafer. On the other hand, when the grinding allowance $h_1$ is 300 μm or less, even in the case of using a support substrate wafer of 150 mm diameter, the grinding allowance $h_1$ is not greater than the half of the wafer's typical thickness of 600 μm to 650 μm and does not result in the outermost peripheral portion of the support substrate wafer having an acute angle. To that end, it is more preferred to set the grinding allowance $h_1$ to 10 μm to 250 μm.

It is also preferred to set $\Delta h$ ($=h_2-h_1$), a finish grinding allowance in height direction in the finish chamfering step S22, to 20 μm to 50 μm. When the finish grinding allowance $\Delta h$ is 20 μm or more, it is possible to remove the grinding strain due to the coarse grinding that uses the low grit number grinding stone 510. When the finish grinding allowance $\Delta h$ is 50 μm or less, it is possible to minimize wearing of the chamfering wheel edge due to finish grinding that uses the high grit number grinding stone 520.

In this case, the total grinding allowance $h_2$ in height direction of the support substrate wafer 10 after the finish chamfering step S22 may be set to 30 μm to 350 μm. When the total grinding allowance $h_2$ is 30 μm or more, it is possible to ensure coarse grinding and minimum finish grinding allowance. The total grinding allowance $h_2$ is set to 350 μm or less because it is the sum of the coarse grinding and maximum finish grinding allowance.

The finish grinding allowance w in horizontal direction in the finish chamfering step S22 is preferably set to 50 μm to 200 μm. When the finish grinding allowance w in horizontal direction is 50 μm or more, it is possible to sufficiently ensure the finish grinding allowance of the active layer's side surface while considering the wafer centering accuracy during chamfering. When the finish grinding allowance w in horizontal direction is 200 μm or less, it is possible to prevent excessive grinding of the active layer's side surface while considering the variation accuracy of the finish grinding allowance.

Figure 6A:
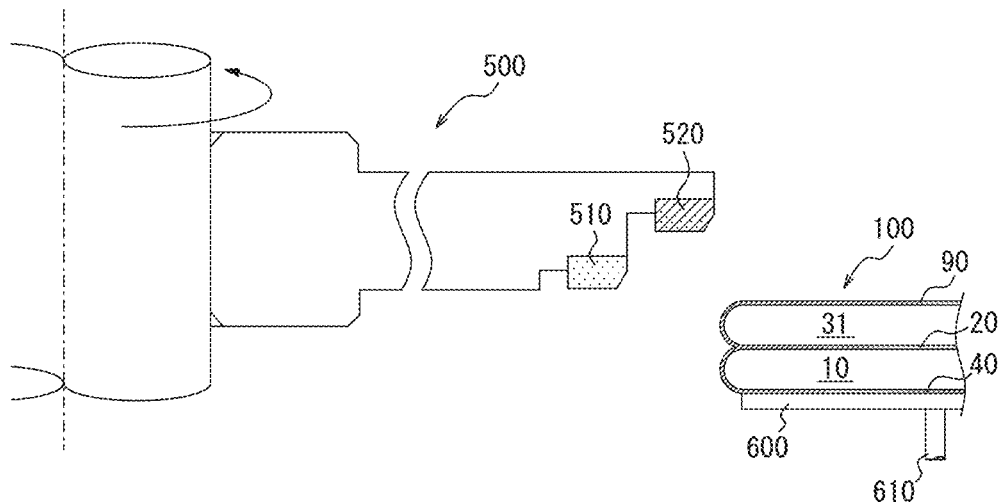
FIG. 6A is a schematic cross-sectional view for explaining a chamfering wheel used in a preferred embodiment of the present disclosure and a terrace forming step using the same.
Figure 6B:
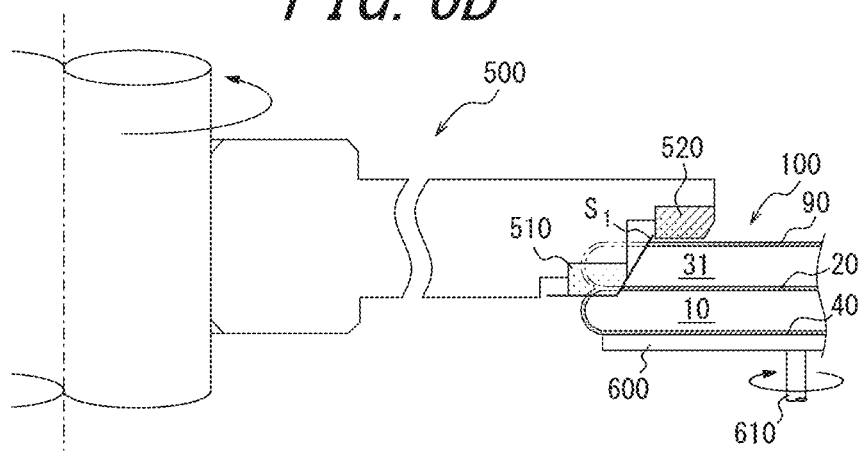
FIG. 6B is a schematic cross-sectional view for explaining a chamfering wheel used in a preferred embodiment of the present disclosure and a terrace forming step using the same, following FIG. 6A.
Figure 6C:
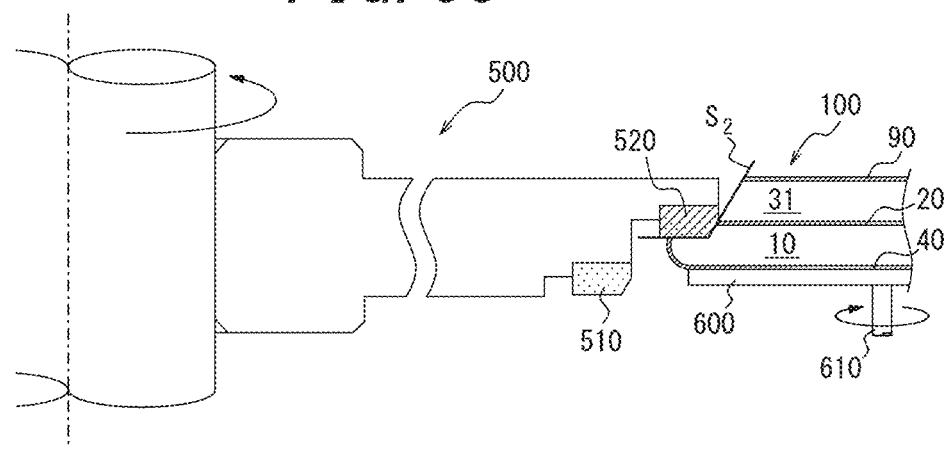
FIG. 6C is a schematic cross-sectional view for explaining a chamfering wheel used in a preferred embodiment of the present disclosure and a terrace forming step using the same, following FIG. 6B.

As shown in FIGS. 6A to 6C, it is preferred to carry out the terrace forming step S20 using the chamfering wheel 500 having the two-stage structure described above. First, as shown in FIG. 6A, alignment between the chamfering wheel 500 and the bonded wafer 100 prior to machining is performed. Upon alignment, the back surface of the bonded wafer 100 may be held by a holder part 600 having a rotating part 610, such as a vacuum chuck.

As shown in FIG. 6B, the relative position between the bonded wafer 100 prior to machining and the chamfering wheel 500 is then adjusted while rotating the chamfering wheel 500 and the bonded wafer 100, and the aforementioned coarse chamfering step S21 is carried out using the low grit number grinding stone 510 to provide a machined surface $S_1$.

Subsequently, without realignment, as shown in FIG. 6C, the relative position between the bonded wafer 100 and the chamfering wheel 500 is adjusted while rotating the chamfering wheel 500 and the bonded wafer 100 during machining, and the aforementioned finish chamfering step S22 is carried out using the high grit number grinding stone 520 to provide a machined surface $S_2$. With this configuration, it is only necessary to perform alignment between the bonded wafer 100 and the chamfering wheel 500 only once in the stage shown in FIG. 6A.

Thus, using the chamfering wheel 500 having the two-stage structure, it is possible to more reliably obtain the finish grinding allowance $\Delta_h$ and the finish grinding allowance w in horizontal direction as intended. Further, in a preferred embodiment shown in FIGS. 6A to 6C, chamfering can be effected without contacting the outermost peripheral edge (end point in the horizontal wafer central axis) of the support substrate wafer 10 with the chamfering wheel 500. Thus, it is also possible to hold the support substrate wafer 10 without having to remove the insulating film 40 by chamfering at the end surface of the support substrate wafer 10.

Herein, carrying out chamfering such that alignment is first performed and no further alignment is performed upon subsequent chamfering to continue chamfering as described above with reference to FIGS. 6A to 6C is referred to as carrying out "continuous" chamfering.

<Strain Removing Step>

After the terrace forming step S20, the strain removing step S30 is carried out for removing the strained region generated during terrace formation. Strain removal can be effected by known etching methods. For example, for silicon wafers, etching can be effected using an aqueous alkaline solution such as tetramethylammonium hydroxide (TMAH) or potassium hydroxide (KOH) aqueous solution. The amount of strain to be removed by etching is preferably minimized to an extent that the strain generated by the finish chamfering step S22 can be removed; the etching allowance is preferably set to, for example, about 0.5 µm to 2 µm. An excessive etching allowance leads to roughened machined surface and/or poorly machined shape due to an etching rate difference that arises from the difference in material between the support substrate wafer 10 and insulating film 20 or between the active layer wafer 31 and the insulating film 20, and/or due to the dependence of the aqueous alkaline solution's etching rate on the crystal plane orientation. It should be noted that because the etching allowance in the strain removing step S30 is smaller than the grinding allowance in the terrace forming step S20, the etching allowance is not illustrated for the purpose of simplifying the drawing.

Through the bonding step S10, the terrace forming step S20 and the strain removing step S30 described above, the bonded wafer 100 according to the present embodiment can be chamfered stably also during chamfering of the insulating film 20. It is thus possible to provide a method of manufacturing a bonded wafer, which method can stably manufacture a bonded wafer wherein a terrace surface is provided on a support substrate wafer.

In the present embodiment, when obtaining the active layer 30 by thinning of the active layer wafer 31, terrace formation may be carried out after thinning, or terrace formation may be carried out before thinning. However, as shown in the flowchart of FIG. 4, the bonded wafer manufacturing method according to the present disclosure preferably further includes a thinning step S40 of thinning the active layer wafer 31 to provide the active layer 30, after the terrace forming step S20. This is because when the terrace forming step S20 is carried out after thinning the active layer wafer 31 to provide the active layer 30, a bare exposed surface is formed on the active layer 30, so that particle adhesion etc. may occur during terrace formation. However, in the case where the thinning step S40 is carried out after the terrace forming step S20, prior to the terrace forming step S20, preliminary thinning of the active layer wafer 31 may be carried out, e.g., by preliminarily grinding or partially peeling off the active layer wafer 31.

The insulating film 40 is preferably provided on the end surface and the back surface of the support substrate wafer 10 of the bonded wafer 100 thus obtained. By providing the insulating film 40, it is possible to prevent particle adhesion from the end surface or back surface of the support substrate wafer 10 for example during wafer handling. Moreover, because the support substrate wafer 10 can be sandwiched between the insulating films 20, 40, it advantageously reduces warping (warping amount can be quantified in accordance with the SEMI standard) in the case where the bonded wafer 100 is subjected to heat treatment.

FIGS. 3 and 6A to 6C illustrate the chamfering wheel 500 having a two-stage structure. The chamfering wheel 500 preferably has a multistage structure and may have a structure having three or more stages. In the case where an additional grinding stone having a different grit number is used in addition to the low grit number grinding stone 510 and the high grit number grinding stone 520, it is preferred to use, between grinding with the grinding stones 510, 520, a grinding stone having a grit number intermediate between the grit numbers of the grinding stones 510, 520. One key aspect of the present disclosure is to use the low grit number grinding stone 510 which is not easily broken or worn when chamfering the insulating film 20 at the bonded surface.

<<Grit Number of Grinding Stone>>

A diamond grinding stone is usually used to chamfer the support substrate wafer 10 or active layer wafer 31. In this case, there is no particular limitation on the grain size of abrasive gains so long as the high-low grit number relationship described above is satisfied; the grit number of the low grit number grinding stone 510 can be #100 to less than #600. More preferably, it is set to #300 to #500. On the other hand, the grit number of the high grit number grinding stone 520 can be #600 to #2,000. More preferably, it is set to #700 to #1200. Further, the difference in grit number between the grinding stones 510, 520 is preferably 200 to 1,500. The grit number of the grinding stone shall conform to JIS B 4130: 1998 (Diamond/CBN products—Grain sizes of diamond or cubic boron nitride).

The following describes a specific embodiment of the bonded wafer 100 suitably applicable to the present disclosure. It should be understood, however, that the present disclosure is not limited to the following specific examples.

As the support substrate wafer 10, a single crystal silicon wafer made of silicon single crystal can be used. The single crystal silicon wafer can be one prepared by slicing, using a wire saw or other tool, a single crystal silicon ingot grown by the Czochralski method (CZ method) or floating zone melting method (FZ method). The single crystal silicon wafer may be doped with carbon and/or nitrogen. Further, the single crystal silicon wafer may be made n-type or p-type by doping with any impurity. The support substrate wafer 10 may be made of bulk compound semiconductor such as GaAs or SiC other than silicon single crystal.

As described above, to form the insulating film 20, for example, heat treatment in an oxidizing atmosphere can be carried out to form a silicon oxide film made of silicon oxide on the surface of the silicon support substrate wafer 10, The material of the insulating film 20 is not limited to silicon oxide; an electric insulator can also be used, e.g., silicon nitride may be used or diamond like carbon (DLC) or the like can also be used. The film thickness of the insulating film 20 at the bonded surface is not limited, but is generally 0.1 µm to 5 µm.

The active layer wafer 31 becomes the active layer 30 through the terrace forming step S20 and, if desired, the thinning step S40. The active layer wafer 31 is a wafer utilized as a device active layer of a bonded wafer such as an SOI wafer, and as with the support substrate wafer 10, a single crystal silicon wafer made of silicon single crystal can be used, or SiC or other material may be used. The active layer wafer 31 may be of the same substrate type as the support substrate wafer 10 or a substrate of different type can be used. Further, in the case of using the same type of substrate, the active layer wafer 31 and the support substrate wafer 10 may have the same or different conductivity type (p type or n type) and conductivity.

The thickness $L_1$ of the support substrate wafer 10 shown in FIG. 2 is not particularly limited, but is generally 200 μm to 1,000 μm. When using a silicon wafer having a diameter of 200 mm, the thickness $L_1$ is usually 725±25 mm, and when using a silicon wafer having a diameter of 300 mm, the thickness $L_1$ is usually 775±25 mm.

The thickness $L_2$ of the support substrate wafer at a portion where the terrace surface $T_A$ is formed is smaller than the thickness $L_1$, and $L_1$-$L_2$ may be usually set to about 30 μm to 300 μm. It should be noted that the thickness $L_2$ is defined by the height from the flat portion of the back surface of the support substrate wafer 10 to the terrace surface $T_A$.

The width of a portion where the terrace surface $T_A$ is formed (hereinafter referred to as "terrace width") is not particularly limited, and in order to secure the area of the active layer 30, the terrace width is preferably small. Usually, the terrace width can be in the range of about 0.5 mm to 5 mm. The inclination angle of the terrace slope surface $T_B$ depends on the inclination angles of the low grit number grinding stone 510 and the high grit number grinding stone 520. The terrace slope surface $T_B$ may be a vertical surface.

The thickness of the active layer 30 is not particularly limited and may be set as appropriate according to the application. When the bonded wafer 100 is used as a thin film SOI, the thickness of the active layer 30 can be 1 μm or less. When the bonded wafer 100 is used as a thick film SOI, the thickness of the active layer 30 can be 10 μm or more.

The term "silicon oxide film" as used herein means one intentionally provided on a surface of a silicon wafer for example by thermal CVD. Thus, even when there is no reference to a silicon oxide film, a natural oxide film of about several nanometers thickness may be formed on a surface of a silicon wafer, and the existence of such a natural oxide film is not excluded herein.

EXAMPLES

The present disclosure will be described further in detail based on an Example, which however shall not be construed as limiting the scope of the present disclosure.

Example 1

Figure 4:
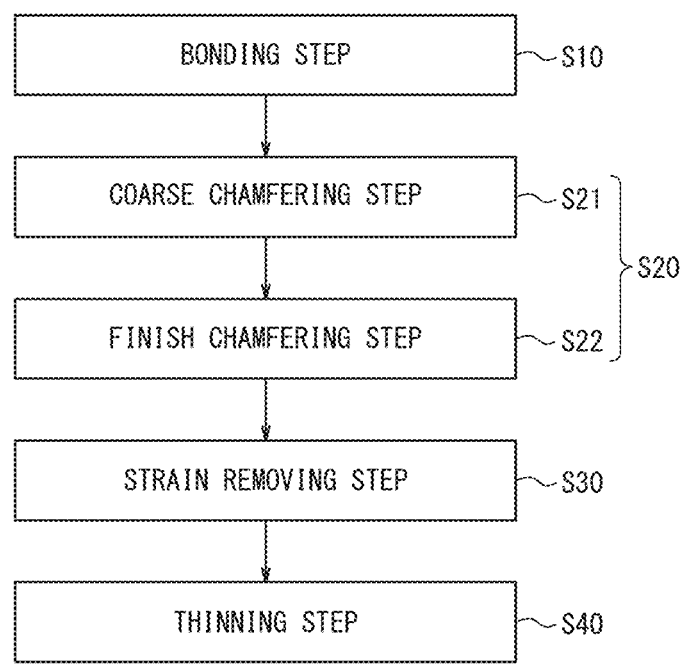
FIG. 4 is a flowchart for explaining a method of manufacturing a bonded wafer according to an embodiment of the present disclosure.

Using the chamfering wheel 500 having the two-stage structure shown in FIG. 3, the bonded wafer 100 shown in FIG. 2 was fabricated according to the flowchart of FIG. 4. A specific process is as described below.

Bonding Step

Silicon wafers having a diameter of 200 mm were provided for use as the support substrate wafer 10 and the active layer wafer 31. Next, the support substrate wafer 10 and the active layer wafer 31 were introduced into a thermal oxide film forming apparatus, and oxide film forming treatment was performed in an oxidizing atmosphere to form an insulating film formed of a silicon oxide film on the support substrate wafer. The active layer wafer 31 and support substrate wafer 10 were then bonded together with the insulating film formed of the silicon oxide film. Next, the bonded wafers were transferred into a vertical heat treatment apparatus having an oxidizing atmosphere and subjected to heat treatment for strengthening the bonding between the wafers. In this way a single bonded wafer was obtained. The thickness of the insulating film 20 after bonding was 1 μm.

Terrace Forming Step

In the same manner as described above with reference to FIGS. 6A to 6C, a machined surface $S_1$ was formed using the low grit number grinding stone 510, and then the machined surface $S_1$ was subjected to finish chamfering using the high grit number grinding stone 520 to form a machined surface $S_2$. Diamond abrasive grains of #400 were used for the low grit number grinding stone 510 and diamond abrasive grains of #800 were used for the high grit number grinding stone 520. The grinding allowance $h_1$ for coarse chamfering in thickness direction from the flat surface of the support substrate wafer 10 immediately under the silicon oxide film was set to 70 μm and the total grinding allowance $h_2$ was set to 90 μm. Thus, the finish grinding allowance Δh was 20 μm. The finish grinding allowance w in horizontal direction was set to 100 μm (see also FIG. 5).

Strain Removing Step

After forming a terrace portion T, alkali etching was performed with TMAH to remove the machining strain. As for the etching amount, the thickness of the strained region was previously determined from a cross-sectional TEM photograph of another sample, and the etching amount was set to 1 μm based on the measured thickness of the strained region.

Thinning Step

Figure 1:
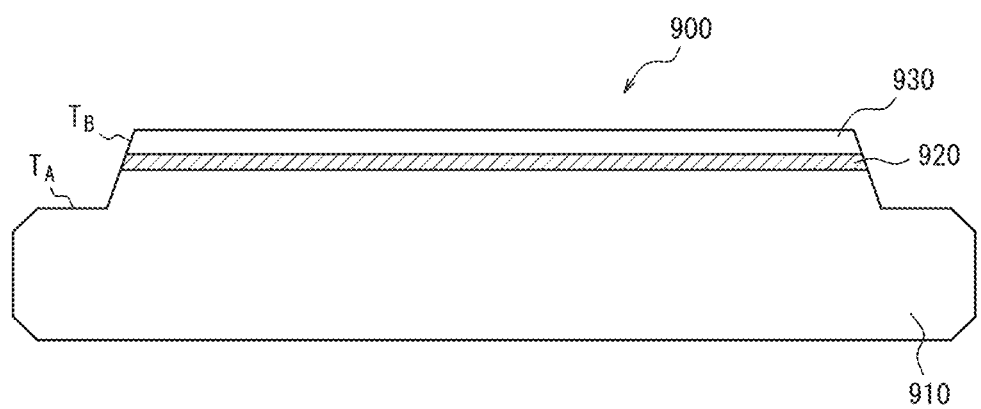
FIG. 1 is a schematic cross-sectional view for explaining an SOI wafer according to prior art.
Figure 7:
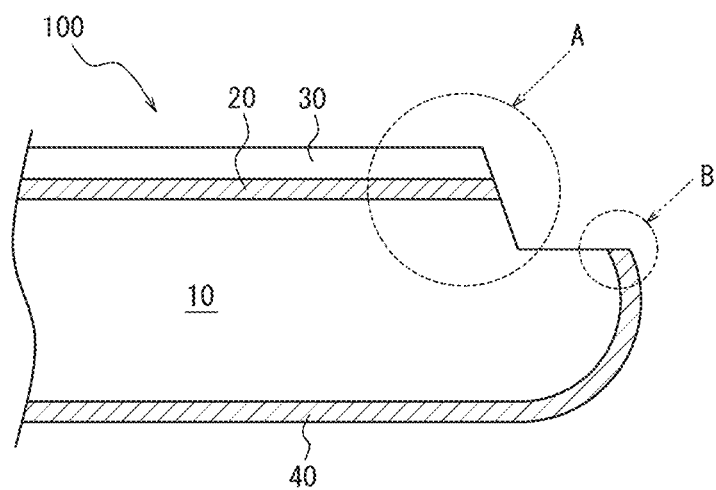
FIG. 7 is a schematic cross-sectional view showing a terrace portion in an Example.
Figure 8A:
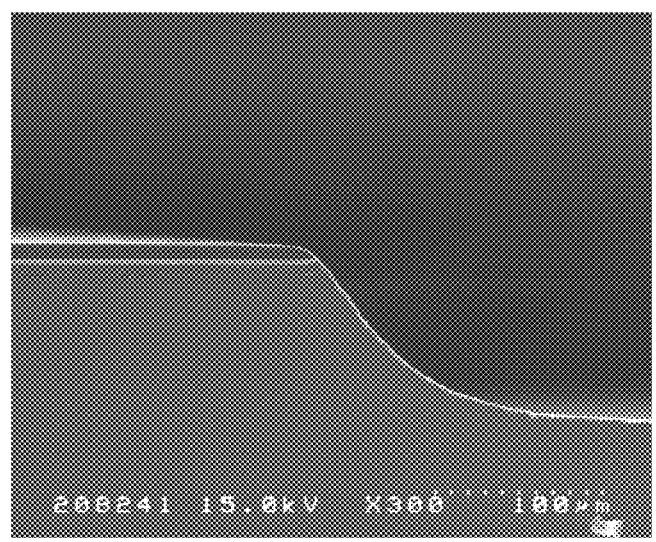
FIG. 8A is a SEM cross-sectional photograph of part A in FIG. 7.
Figure 8B:
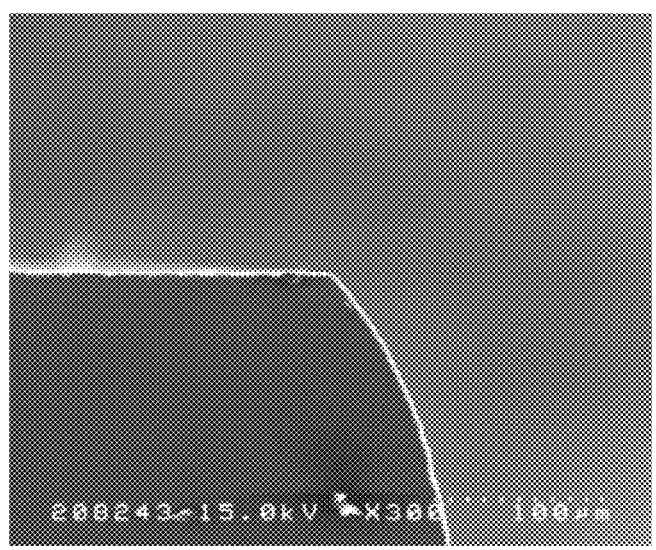
FIG. 8B is a SEM cross-sectional photograph of part B in FIG. 7.

Finally, the active layer wafer 31 was thinned to provide the active layer 30 having a film thickness of 13 μm. In this way the bonded wafer 100 shown in FIGS. 1 and 7 was obtained. FIG. 7 is an enlarged view of an end portion of the bonded wafer 100. SEM cross-sectional photographs of part A and part B shown in FIG. 7 are shown in FIGS. 8A and 8B, respectively. As shown in FIGS. 1 and 7, the insulating film 40 made of silicon oxide is formed on the end surface and the back surface of the support substrate wafer 10 of the bonded wafer 100.

This chamfering was carried out on 100 bonded wafers and every bonded wafer had a good machined surface.

Comparative Example

A bonded wafer 100 was fabricated as in the Example except that a chamfering wheel having a single stage structure was used instead of the chamfering wheel having the two-stage structure used in the Example and that only diamond abrasive grains of #800 were used as a grinding stone.

This chamfering was carried out on 100 bonded wafers. The 30th and subsequent bonded wafers had a poorly machined final surface, with the 99th bonded wafer having a stepped machined surface due to failure to completely remove the silicon oxide film by grinding.

From the above results, it was confirmed that the use of the manufacturing method according to the present disclosure enabled stable manufacture of the bonded wafer 100 wherein the terrace surface $T_A$ is provided on the support substrate wafer 10.

INDUSTRIAL APPLICABILITY

According to the present disclosure, it is possible to provide a method of manufacturing a bonded wafer, which method can stably manufacture a bonded wafer wherein a terrace surface is provided on a support substrate wafer.

10 Support substrate wafer
20 Insulating film at bonded surface
30 Active layer
31 Active layer wafer
40 Insulating film of support substrate wafer
90 Insulating film of active layer wafer
100 Bonded wafer
500 Chamfering wheel
510 Low grit number grinding stone
520 High grit number grinding stone
600 Holder part
610 Rotating part
$S_1$ Machined surface after coarse chamfering
$S_2$ Machined surface after finish chamfering
$T_A$ Terrace surface
$T_B$ Terrace slope surface
T Terrace portion

The invention claimed is:

1. A method of manufacturing a bonded wafer, comprising:
    a bonding step of bonding a support substrate wafer and an active layer wafer with an insulating film;
    a terrace forming step of forming a terrace surface on the support substrate wafer; and
    a strain removing step of removing a strained region generated by the terrace forming step,
    wherein the terrace forming step is carried out using a chamfering wheel which comprise a low grit number grinding stone and a high grit number grinding stone having a higher grit number than the low grit number grinding stone, and
    wherein the terrace forming step comprises:
    a coarse chamfering step of chamfering, after chamfering the active layer wafer, the insulating film from the active layer wafer side and further chamfering the support substrate wafer, using the low grit number grinding stone; and
    a finish chamfering step of finish chamfering, after the coarse chamfering step, a machined surface obtained from the coarse chamfering step, using the high grit number grinding stone.

2. The method of claim 1, wherein the chamfering wheel has a multistage structure in which discs having different diameters are concentrically disposed, wherein the low grit number grinding stone is provided at a periphery of an inner diameter portion of the chamfering wheel and the high grit number grinding stone is provided at a periphery of an outer diameter portion located more outward than the inner diameter portion, and
    wherein the coarse chamfering step and the finish chamfering step are carried out continuously using the chamfering wheel having the multistage structure.

3. The method of claim 1, further comprising, after the terrace forming step, a thinning step of thinning the active layer wafer to provide an active layer.

4. The method of claim 1, wherein the active layer wafer is formed of a silicon wafer.

5. The method of claim 1, wherein the insulating film is made of silicon oxide.

6. The method of claim 1, wherein the insulating film is provided on an end surface and a back surface of the support substrate wafer.

* * * * *